(12) United States Patent
Lee (10) Patent No.: US 8,020,960 B2
(45) Date of Patent: Sep. 20, 2011

(54) INKJET PRINTING SYSTEM AND MANUFACTURING METHOD OF DISPLAY DEVICE USING THE SAME

(75) Inventor: Youn-Ho Lee, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 462 days.

(21) Appl. No.: 12/339,115

(22) Filed: Dec. 19, 2008

(65) Prior Publication Data

US 2010/0020122 A1   Jan. 28, 2010

(30) Foreign Application Priority Data

Jul. 25, 2008   (KR) .................. 10-2008-0072703

(51) Int. Cl.
*G01B 11/22* (2006.01)
*G01B 11/02* (2006.01)
*B05D 5/06* (2006.01)
*B41J 29/393* (2006.01)

(52) U.S. Cl. .......... 347/19; 356/627; 356/629; 356/630; 427/162

(58) Field of Classification Search ............ 347/19; 356/627, 629, 630; 427/162
See application file for complete search history.

(56) References Cited

U.S. PATENT DOCUMENTS

2002/0145641 A1 * 10/2002 Bronswijk et al. .............. 347/19
* cited by examiner

*Primary Examiner* — Julian Huffman
(74) *Attorney, Agent, or Firm* — Cantor Colburn LLP (57) ABSTRACT

An inkjet printing system includes; a stage configured for mounting a substrate thereon, an inkjet head which drips an ink droplet on the substrate, a conveying device which moves the inkjet head, and a measuring device which measures a height of the ink droplet on the substrate.

19 Claims, 11 Drawing Sheets

INKJET PRINTING SYSTEM AND MANUFACTURING METHOD OF DISPLAY DEVICE USING THE SAME

This application claims priority to Korean Patent Application No. 10-2008-0072703, filed on Jul. 25, 2008, and all the benefits accruing therefrom under 35 U.S.C. §119, the contents of which in its entirety are herein incorporated by reference.

BACKGROUND OF THE INVENTION (a) Field of the Invention

The present invention relates to an inkjet printing system and a manufacturing method of a display device using the same.

(b) Description of the Related Art

A flat panel display is a display device that is thin compared with the size of the screen thereof, and a liquid crystal display ("LCD") and an organic light emitting device ("OLED") are among the most widely used flat panel displays.

As one of the most widely used flat panel displays, a liquid crystal display ("LCD") includes two display panels with a liquid crystal layer interposed therebetween, and a plurality of color filters for displaying colors. In the two display panels, electric field generating electrodes such as a pixel electrode and a common electrode, and an alignment film are formed. The alignment layer determines initial alignment of liquid crystal molecules, and the electric field generating electrodes change alignment of the liquid crystal molecules of the liquid crystal layer by generating an electric field therebetween. In such an LCD, incident light passing through the liquid crystal layer has a polarization state that varies according to an alignment state of the liquid crystal molecules, and the variation of the polarization state effects transmittance variation of light through the LCD, usually due to the use of a polarizer.

An OLED includes two electrodes (e.g., a pixel electrode and a common electrode, similar to the LCD) and an emission layer interposed between the two electrodes, in which electrons injected from one electrode and holes injected from the other electrode combine in the emission layer to generate excitons, and as the excitons discharge energy, the OLED display emits light.

Display devices such as an LCD or OLED further include a switching element connected to a pixel electrode, and a plurality of signal lines such as a gate light and a data line for applying a voltage to the pixel electrode by controlling the switching element.

The constituent elements of the display device are generally formed through a photolithography process. However, as the flat panel display increases in size, the amount of a material, such as a photo-resist, deposited on a substrate to form the constituent elements of the display device in a form of a thin film patterns also increases. Accordingly, manufacturing cost increases, and manufacturing equipment required for a photolithography process becomes larger.

In order to minimize the manufacturing costs and the manufacturing equipment size, an inkjet printing system that forms a thin film pattern by dripping ink has been developed. The inkjet printing system includes an inkjet printing main body and an inkjet head having a plurality of nozzles. In the inkjet printing system, ink is dripped on a substrate through the nozzles of the inkjet head.

In order to discharge a desired amount of ink, a process for measuring and controlling the amount of ink discharged through the nozzles of the inkjet head is required prior to using the inkjet printing system in a manufacturing process.

BRIEF SUMMARY OF THE INVENTION

An exemplary embodiment of an inkjet printing system according to the present invention includes; a stage configured for mounting a substrate thereon, an inkjet head which drips an ink droplet on the substrate, a conveying device which moves the inkjet head, and a measuring device which measures a height of the ink droplet on the substrate.

In one exemplary embodiment, the measuring device may include; a light source, a mid-mirror which transmits light from the light source through a first side thereof and reflects incident light from a second side substantially opposite the first side, a photodetector which detects an amount of light, a pinhole plate disposed between the mid-mirror and the photodetector and including a pinhole, a horizontal scanning unit configured to move in a horizontal direction.

In one exemplary embodiment, the measuring device may further comprise a vertical scanning unit configured to move in a vertical direction.

Another exemplary embodiment of an inkjet printing system according to the present invention includes; a stage configured for mounting a substrate thereon, an inkjet head which drips an ink droplet on the substrate, a conveying device which moves the inkjet head, and a measuring device which obtains a volume of the ink droplet on the substrate.

In one exemplary embodiment, the measuring device may include; a light source, a mid-mirror which transmits light from the light source through a first side thereof and reflects incident light from a second side substantially opposite the first side, a photodetector which detects an amount of light, a pinhole plate disposed between the mid-mirror and the photodetector and including a pinhole, a horizontal scanning unit configured to move in a horizontal direction, In one exemplary embodiment, the measuring device may further comprise a vertical scanning unit configured to move in a vertical direction.

In one exemplary embodiment, the light source may comprise a semiconductor laser.

In one exemplary embodiment, the measuring device may further comprise an object lens which gathers light that has passed through the mid-mirror at a focus.

In one exemplary embodiment, the measuring device may obtain the volume of the ink droplet by measuring the height of the ink droplet.

In one exemplary embodiment, the measuring device may obtain the volume of the ink droplet by further measuring a surface area of a contact region between the ink droplet and the substrate.

In one exemplary embodiment, the measuring device may obtain the volume of the ink droplet by measuring an area of a cross-section of the ink droplet which is substantially perpendicular to a plane of the substrate.

An exemplary embodiment of a method of manufacturing a display device using an inkjet printing system which includes a stage, an inkjet head, a conveying device, and a measuring device according to an exemplary embodiment of the present invention includes; mounting a substrate on the stage of the inkjet printing system, placing the inkjet head of the inkjet printing system over the substrate, dripping an ink droplet on the substrate, obtaining a volume of the ink droplet using the measuring device, and controlling dripping of subsequent ink droplets based on the obtained volume.

In one exemplary embodiment, the measuring device may include; a light source, a mid-mirror which transmits light from the light source through a first side thereof and reflects incident light from a second side substantially opposite the first side, a photodetector which detects an amount of light, a pinhole plate disposed between the mid-mirror and the photodetector and including a pinhole, a horizontal scanning unit configured to move in a horizontal direction.

In one exemplary embodiment, the measuring device may further comprise a vertical scanning unit configured to move in a vertical direction.

In one exemplary embodiment, the obtaining of the volume of the ink droplet may comprise measuring a height of the ink droplet and a surface area of a contact region between the ink droplet and the substrate using the measuring device.

In one exemplary embodiment, the obtaining of the volume of the ink droplet may comprise measuring an area of a cross-section of the ink droplet which is substantially perpendicular to a plane of the substrate by using the measuring device.

In one exemplary embodiment, the measuring of the area of the cross-section of the ink droplet which is perpendicular to the plate of the substrate may comprise moving the horizontal scanning unit and the vertical scanning unit.

In one exemplary embodiment, the measuring device may measure the area of the cross-section of the ink droplet which is substantially perpendicular to the plane of the substrate by scanning the ink droplet along the plane of the substrate.

In one exemplary embodiment, the manufacturing method may further include hardening the ink droplet by applying heat.

In one exemplary embodiment, the obtaining of the volume of the ink droplet may be performed at at least one location inside or outside the inkjet printing system.

In one exemplary embodiment, dismounting the substrate and mounting a substrate for a display device on the stage may be further performed after the obtaining of the volume of the ink droplet.

In one exemplary embodiment, the ink may be one of ink for forming wiring components, ink for forming a color filter, ink for forming an organic light emitting member, and ink for forming an alignment layer.

DETAILED DESCRIPTION OF THE INVENTION

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 1:
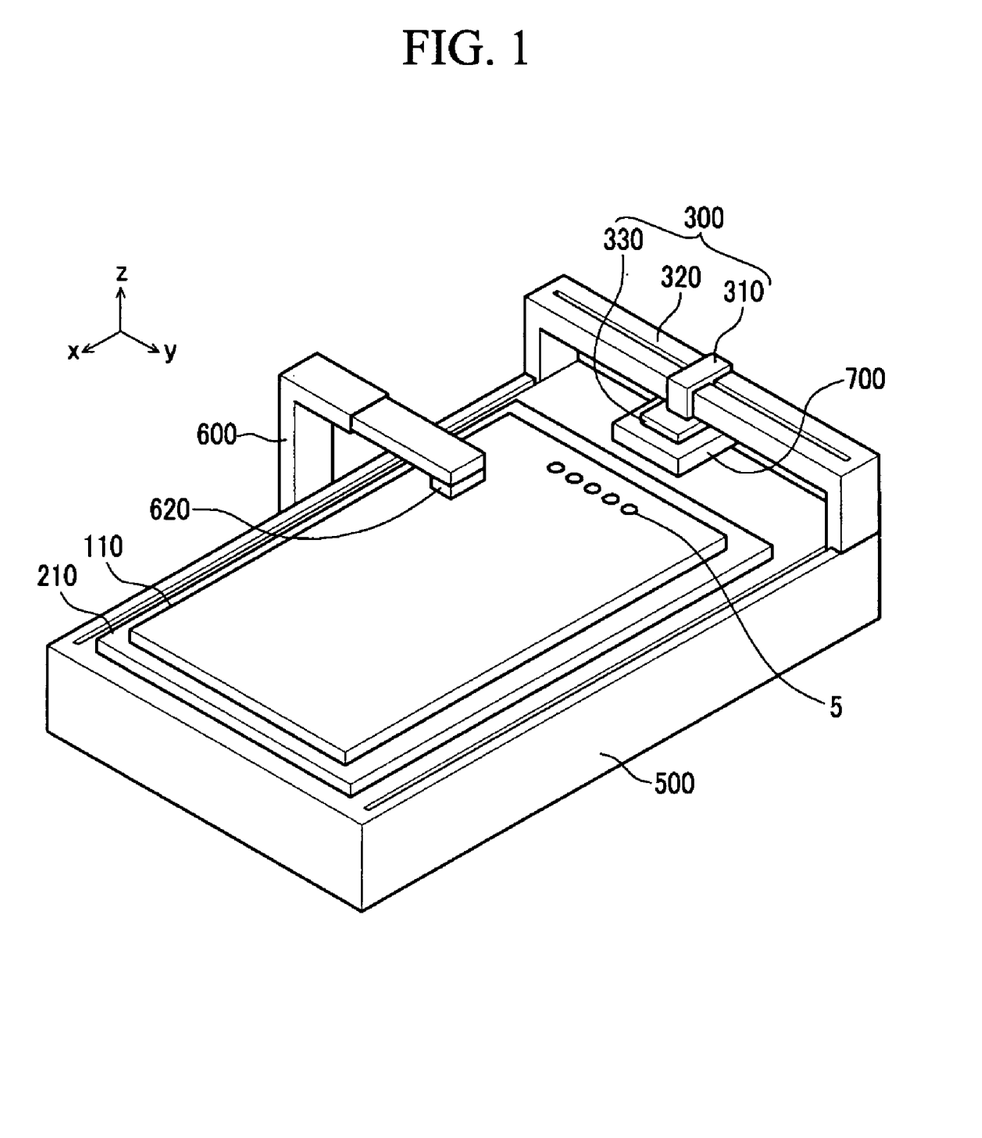
FIG. 1 is a perspective view of an exemplary embodiment of an inkjet printing system according to the present invention.
Figure 2:
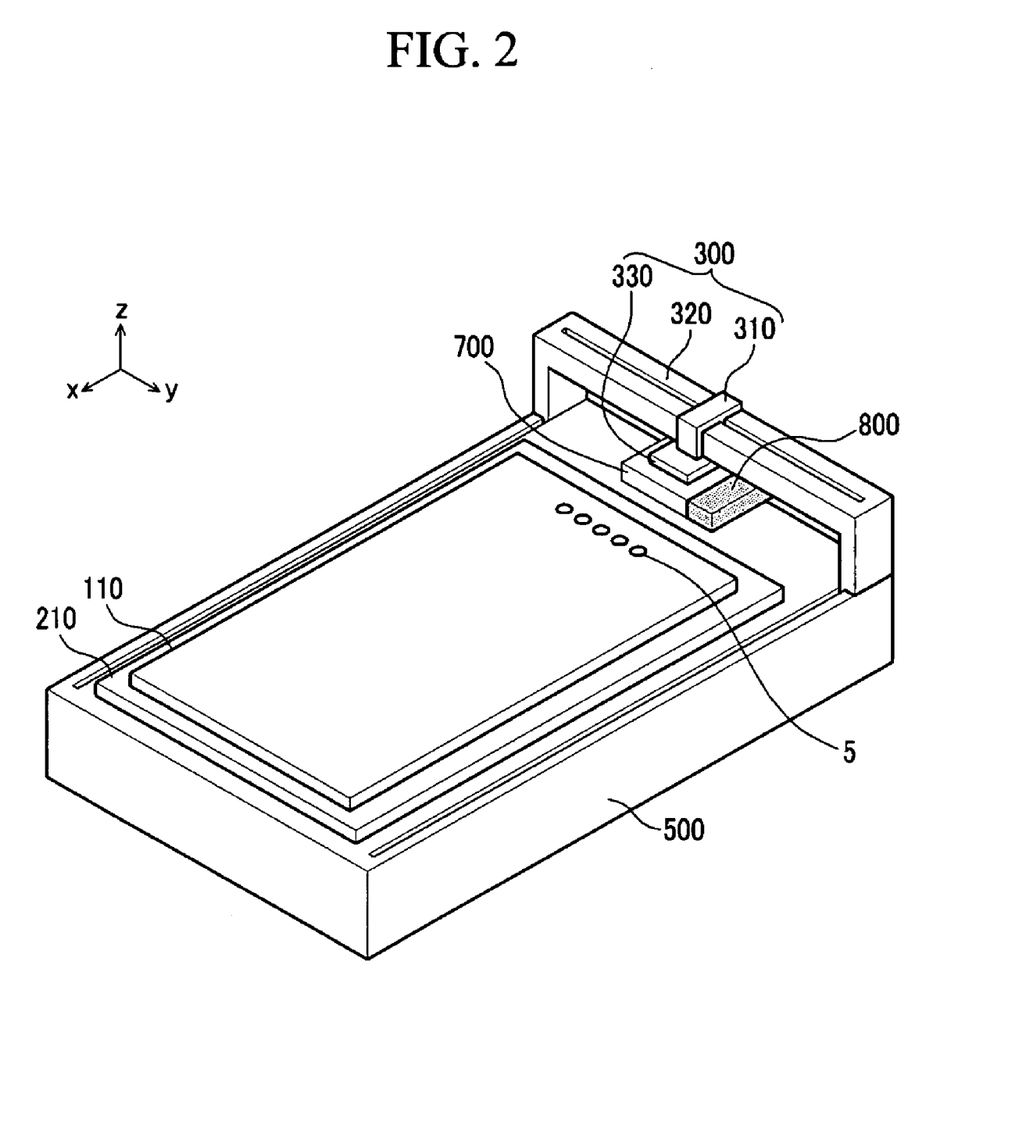
FIG. 2 is a perspective view of another exemplary embodiment of an inkjet printing system according to the present invention.

With reference to FIG. 1 and FIG. 2, an exemplary embodiment of an inkjet printing system according to an exemplary embodiment of the present invention will be described in detail.

FIG. 1 and FIG. 2 respectively show perspective views of exemplary embodiments of an inkjet printing system according to the present invention.

Referring to FIG. 1, an exemplary embodiment of an inkjet printing system according to the present invention includes a supporting substrate 210 and a stage 500 on which a substrate 110 is mounted, an inkjet head 700, a conveying device 300 for conveying the inkjet head 700, a measuring device 620, and a measurement conveying device 600 for conveying the measuring device 620 across the stage 500.

In one exemplary embodiment, the supporting substrate 210 and the stage 500 may be larger than the substrate 110 in order to support the substrate 110. In one exemplary embodiment, heat may be applied to the supporting substrate 210 which is mounted on the stage 500 so that an ink droplet 5 dripped onto the substrate 110 may be hardened. In such an exemplary embodiment, the droplet 5 may have a thermosetting property. In one exemplary embodiment, when an alignment layer of a liquid crystal display ("LCD") is manufactured using the exemplary embodiment of an inkjet printing system according to the present invention, the ink droplet 5 may be a polyimide. Alternative exemplary embodiments include configurations wherein the supporting substrate 210 may be omitted, and in such exemplary embodiments, the stage 500 may be heated so that the ink droplet 5 may be hardened.

The inkjet head 700 is disposed over the stage 500 at a predetermined distance therefrom. A plurality of nozzles (not shown) are formed on a bottom side of the inkjet head 700, and an ink droplet 5 is emitted therefrom onto the substrate 110 through at least one of the plurality of nozzles.

The conveying device 300 conveys the inkjet head 700 across the stage 500 so that the inkjet head 700 is positioned at a predetermined distance from the substrate 110. In the present exemplary embodiment, the conveying device 300 includes a Y-direction conveying device 310 for conveying the inkjet head 700 in the Y-axis direction, an X-direction conveying device 320 for conveying the inkjet head 700 in the X-axis direction, and a lifter 330 for lifting the inkjet head 700 along the Z-axis direction.

The measuring device 620 measures a cross-sectional area and a height of the ink droplet 5 dripped on the substrate 110 from the inkjet head 700 to obtain or measure a volume of the ink droplet 5. In the present exemplary embodiment, the measuring device 620 includes a sensor that scans the ink droplet 5 using a light source and measures the cross-section area or height of the ink droplet 5. In the present exemplary embodiment, the measurement conveying device 600 locates the measuring device 620 over an ink droplet 5 to be measured.

Referring to FIG. 2, another exemplary embodiment of an inkjet printing system according to the present invention includes a supporting substrate 210 and a stage 500 on which a substrate 110 is mounted, an inkjet head 700 and a conveying device 300 for conveying the inkjet head 700 similar to the previous exemplary embodiment. However, in the present exemplary embodiment, and the inkjet printing system includes a measuring device 800 attached to the conveying device 300.

In the present exemplary embodiment, unlike the above-described exemplary embodiment shown in FIG. 1, the measuring device 800 for obtaining a volume of an ink droplet 5 is attached beside the inkjet head 700. The measuring device 800 may be conveyed to a desired position using the conveying device 300. Alternative exemplary embodiments include configurations wherein the measuring device 800 may be attached to the bottom side of the inkjet head 700 or to the conveying device 300.

Alternative exemplary embodiments include configurations wherein the measuring device 800 may be positioned at other locations of the inkjet printing system that are different from that shown in FIG. 1 and FIG. 2.

The measuring device of an exemplary embodiment of an inkjet printing system according to the present invention will be described in further detail with reference to FIG. 3 and FIG. 4.

Figure 3:
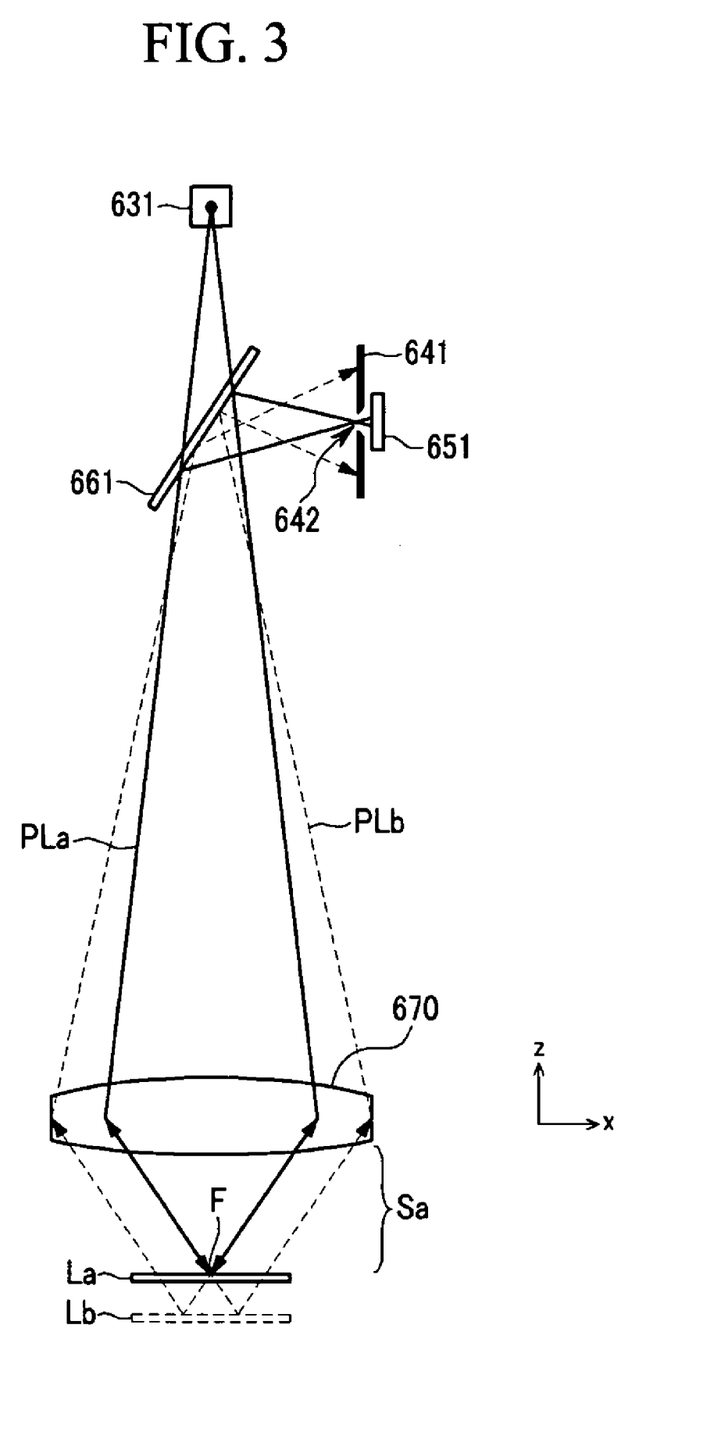
FIG. 3 illustrates a structure and a principle of an exemplary embodiment of a measuring device of an exemplary embodiment of an inkjet printing system according to the present invention.
Figure 4:
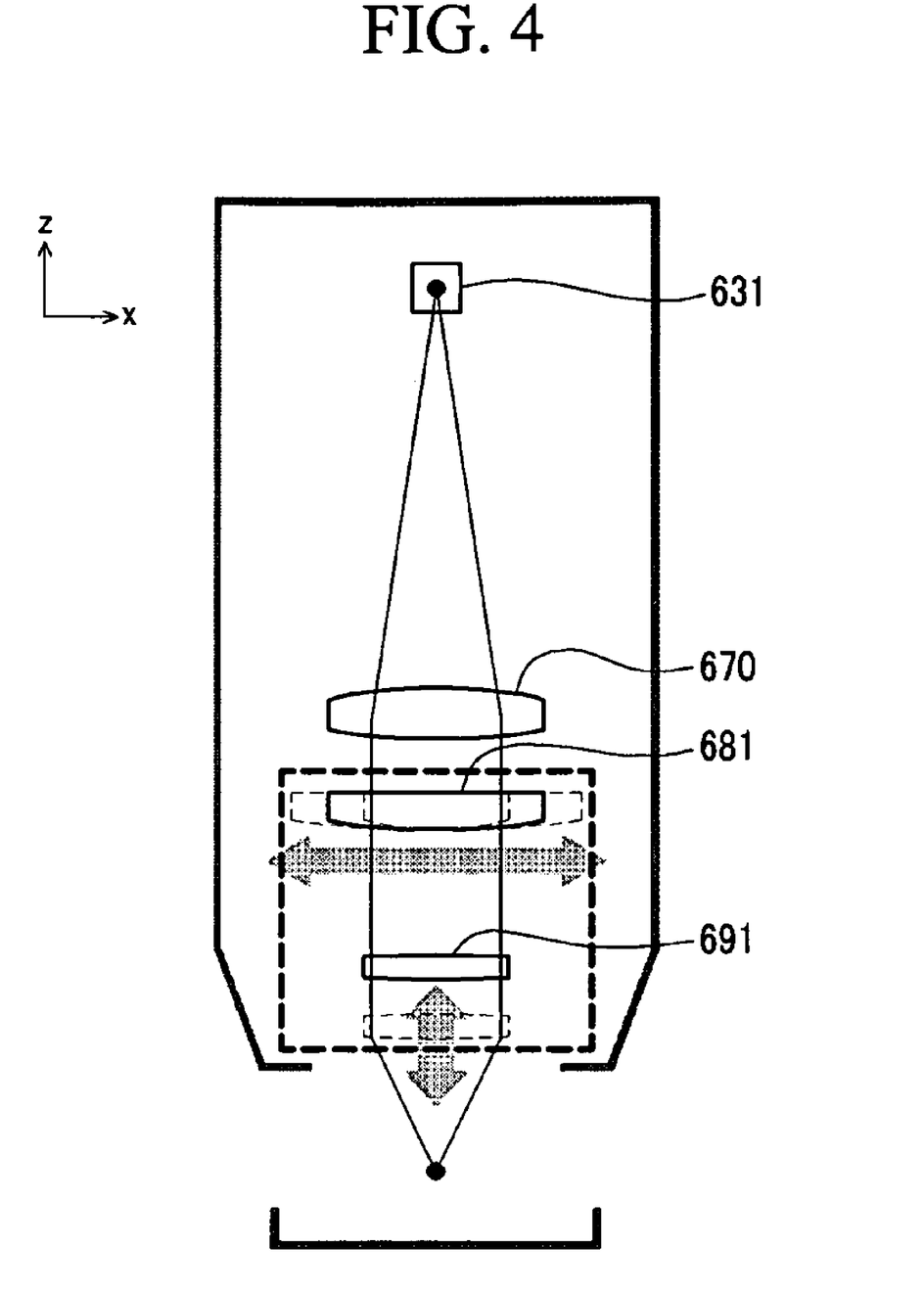
FIG. 4 illustrates a structure and a principle of an exemplary embodiment of a measuring device of an exemplary embodiment of an inkjet printing system according to the present invention.

FIG. 3 and FIG. 4 respectively show structures and principles of the measuring devices 620 and 800 of an exemplary embodiment of an inkjet printing system according to the present invention.

Referring to FIG. 3 and FIG. 4, an exemplary embodiment of a measuring device of an exemplary embodiment of an inkjet printing system according to the present invention includes a light source 631, a mid-mirror 661, a pinhole plate 641, a photodetector 651, an object lens 670, a horizontal scanning unit 681, and a vertical scanning unit 691.

In the present exemplary embodiment, the light source 631 is a point light source, exemplary embodiments of which may include a laser light source such as a semiconductor laser, which can provide light having high intensity.

The mid-mirror 661 is obliquely inclined with respect to light from the light source 631. The mid-mirror 661 may transmit light incident onto the upper side of the mid-mirror 661 from the light source 631 toward the object lens 670, and it may reflect light incident onto the bottom side of the mid-mirror 661 returning back toward the pinhole plate 641.

The pinhole plate 641 includes a pinhole 642 at a center thereof, and transmits light passing through the pinhole 642 to the photodetector 651.

The photodetector 651 receives the light that has passed through the pinhole 642 and measures an amount of light.

The object lens 670 changes the path of light from the light source 631 that has passed through the mid-mirror 661 so that light may be focused as will be described in more detail below.

Referring to FIG. 3 and FIG. 4, the horizontal scanning unit 681 and the vertical scanning unit 691 are disposed at a location Sa under the object lens 670. As shown in FIG. 4, the horizontal scanning unit 681 may be moved horizontally as indicated by the arrows, e.g., along the X-axis, to scan an ink droplet 5 to be measured in the X-axis direction, and the vertical scanning unit 691 may be moved vertically as indicated by the arrows, e.g., along the Z-axis direction, to scan the ink droplet to be measured in the Z-axis direction.

A measurement principle of the measuring device of an exemplary embodiment of an inkjet printing system according to the present invention will now be described.

Referring to FIG. 3, light emitted from the light source 631 passes through the mid-mirror 661 and the object lens 670, and then focused at a focus F.

When light is reflected at the location La of the focus F, light may take the same path as the incident path PLa to be reflected at the mid-mirror 661 and arrive at the pinhole 642. Light that has passed through the pinhole 642 is detected by the photodetector 651.

When light is reflected at a non-focusing location Lb rather than the focusing location La, that light may take another path PLb which deviates from the incident path PLa to reach the mid-mirror 661. Light reflected by the mid-mirror 661 is dispersedly gathered on the pinhole plate 641. Therefore, the amount of light that passes through the pinhole 642 is so small that an amount of light detected by the photodetector 651 is small. Accordingly, it can be shown that a portion of an object like an ink droplet 5 is located at the focusing location La.

Through the above-described process, the horizontal and vertical scanning units 681 and 691 may measure a cross-section area on the X-Z plane of an object like an ink droplet while moving in the X-axis direction and the Z-axis direction to change the focusing location La (i.e., light path) and scanning the object along the X- and Y-axes directions. Exemplary embodiments include configurations wherein only one of the horizontal scanning unit 681 and the vertical scanning unit 691 may be moved.

An exemplary embodiment of a method for manufacturing a display device using the exemplary embodiment of an inkjet printing system described above will now be described in detail.

First, an exemplary embodiment of a method for measuring an ink droplet 5 emitted from the inkjet head 700 of the exemplary embodiment of an inkjet printing system will be described with reference to FIG. 1, FIG. 3, FIG. 4, and FIG. 5 to FIG. 8.

Figure 5:
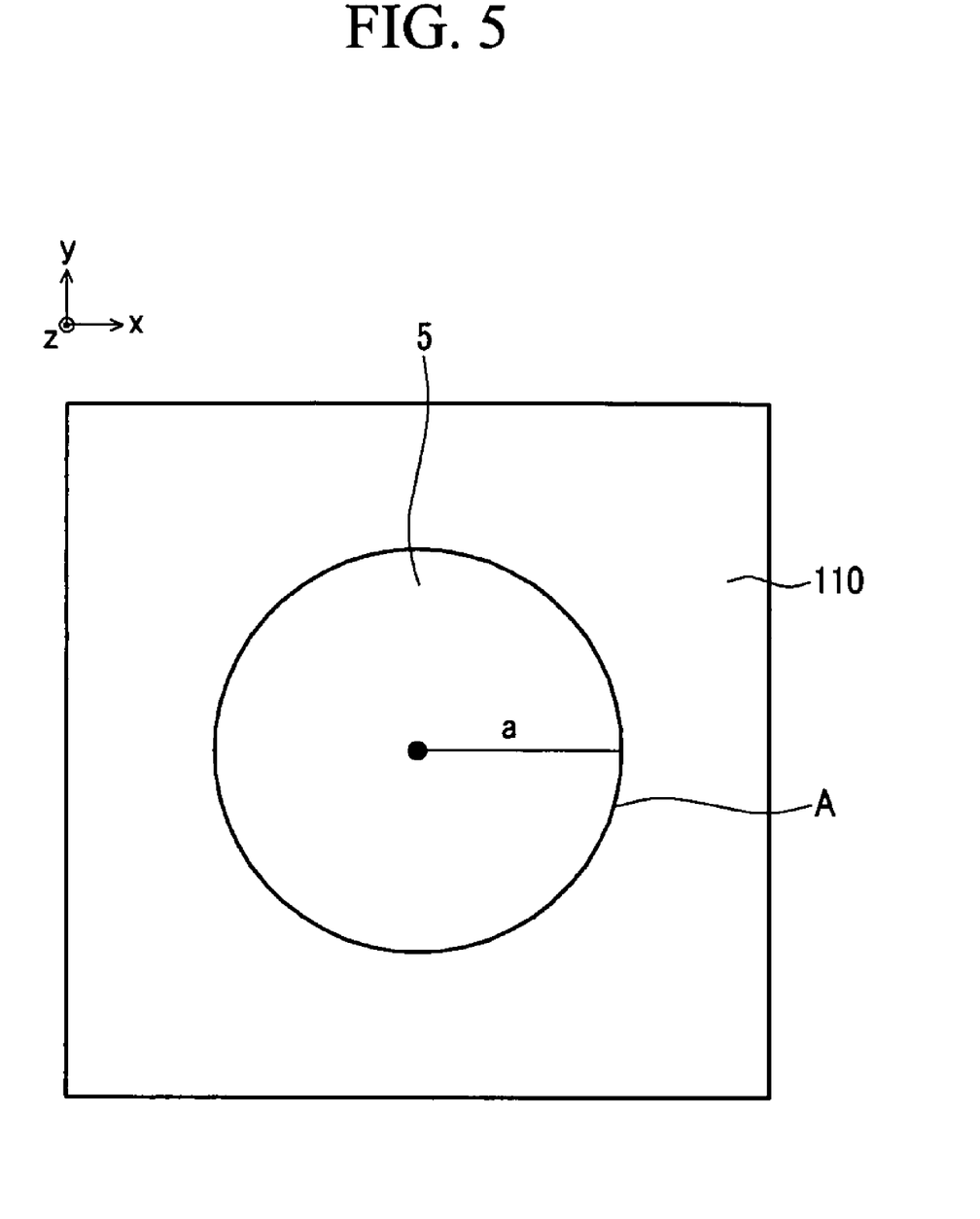
FIG. 5 is a top plan view of an ink droplet discharged from an exemplary embodiment of an inkjet printing system according to the present invention.
Figure 6:
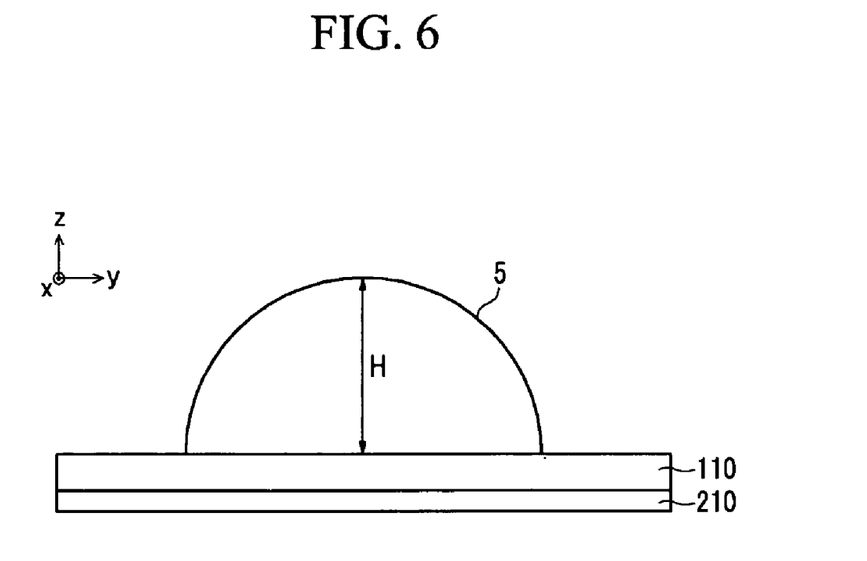
FIG. 6 is a cross-sectional view of an ink droplet discharged from an exemplary embodiment of an inkjet printing system according to the present invention.
Figure 7:
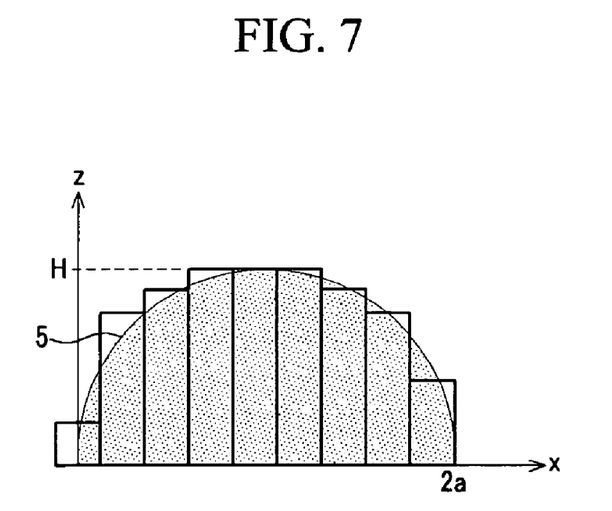
FIG. 7 is a cross-sectional view of an exemplary embodiment of a method for measuring a cross-sectional area of an ink droplet discharged from an exemplary embodiment of an inkjet printing system according to the present invention.
Figure 8:
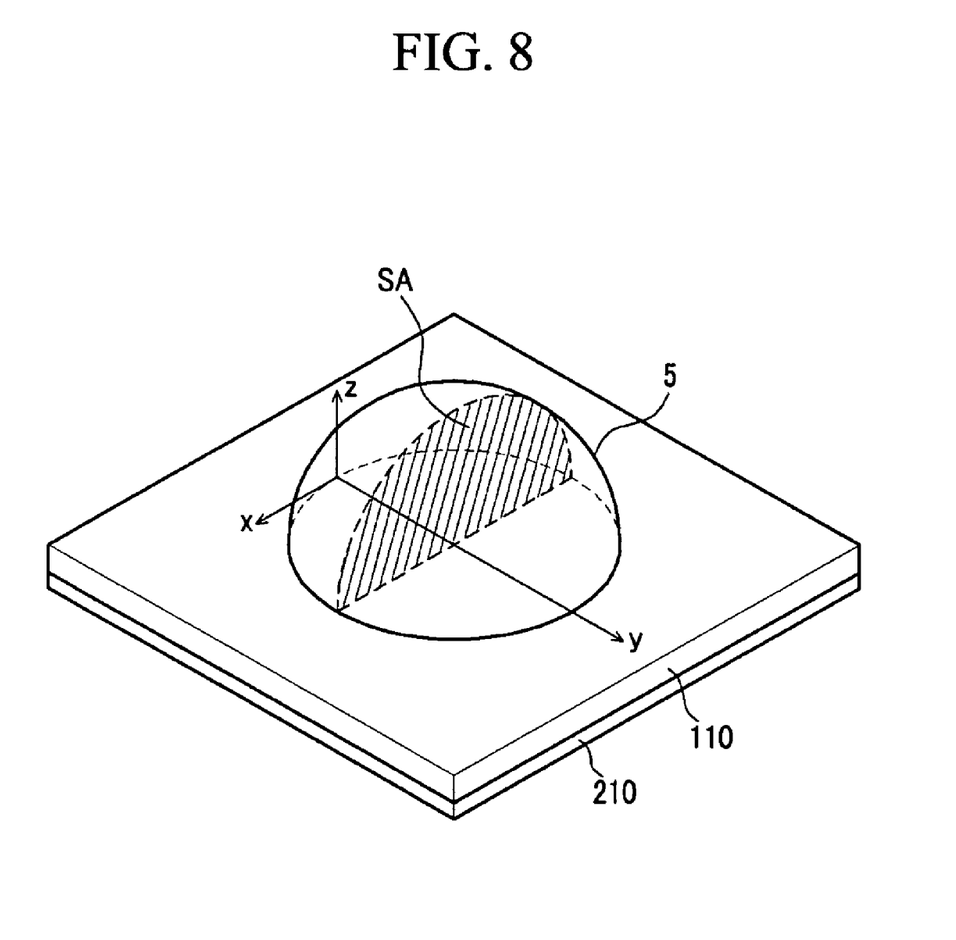
FIG. 8 is a front perspective view of an ink droplet discharged from an exemplary embodiment of an inkjet printing system according to the present invention.

FIG. 5 is a top plan view of an ink droplet 5 discharged from an exemplary embodiment of an inkjet printing system according to the present invention, FIG. 6 is a cross-sectional view of an ink droplet 5 discharged from an exemplary embodiment of an inkjet printing system according to the present invention, FIG. 7 is a cross-sectional view of a method for measuring a cross-section area of an ink droplet 5 discharged from an exemplary embodiment of an inkjet printing system according to the present invention, and FIG. 8 is a front perspective view of an ink droplet 5 discharged from an exemplary embodiment of an inkjet printing system according to the present invention.

First, a substrate 110 is mounted on the stage 500 or on the supporting substrate 210 disposed on the stage 500, and the inkjet head 700 is located over the substrate 110 using the conveying device 300.

Next, an ink droplet 5 is dripped onto the substrate 110 through the nozzles (not shown) of the inkjet head 700.

Heat is applied to the supporting substrate 210 to harden the ink droplet 5 dripped on the substrate 110. Exemplary embodiments include configurations wherein heating of the supporting substrate 210 may be performed before or after the ink droplet 5 is dripped onto the substrate 110. Alternatively, in an exemplary embodiment wherein the supporting substrate 210 is omitted, the ink droplet 5 may be hardened by applying heat to the stage 500, and in this case, a heating process may be omitted.

Next, the measuring device 620 is located above an ink droplet 5 to be measured using the measurement conveying device 600.

Referring to FIG. 5 and FIG. 6, the measuring device 620 measures a cross-section area "A", a radius "a", and a height "H" of the ink droplet 5 on an X-Y plane, that is an interface of the ink droplet 5 and the substrate 110. In this case, the cross-section area A on the X-Y plane may be measured by moving the horizontal scanning unit 681 of the measuring device 620 in the X-axis direction. For scanning in the Y-axis direction, the measuring device 620 may further include a separate scanning unit (not shown) or may use the conveying device 600. The height H of the ink droplet 5 may be measured by moving the vertical scanning unit 691 in the Y-axis direction.

The measuring device 620 calculates a volume of the ink droplet 5 from the measured cross-section area A and the height H of the ink droplet 5. For example, when it is assumed that the ink droplet 5 is a semi-ellipsoid, a volume V may be obtained as given in Equation 1.

$$V = 2a^2\pi H/3 = 2AH/3 \quad \text{(Equation 1)}$$

Here, "a" denotes a radius of a cross-section when it is a circle. The weight of the ink discharged at a time from the nozzles (not shown) of the inkjet head 700 may be obtained by multiplying the volume V by the density of the ink droplet 5.

Alternatively, referring to FIG. 7, an area of the ink droplet 5 on the X-Z plane may be measured by moving both of the horizontal scanning unit 681 and the vertical scanning unit 691 of the measuring device 620. FIG. 7 exemplarily shows a method for measuring heights in the Z-axis direction at nine locations in the X-axis direction.

Referring to FIG. 8, the measuring device 620 measures a cross-section area SA of the ink droplet 7 on the X-Z plane as shown in FIG. 7 while moving along the Y-axis direction, and may calculate a volume of the ink droplet 5.

An exemplary embodiment of a method for measuring a discharged ink droplet 5 using the inkjet printing system of FIG. 2 is almost the same as the above-described method, except that the volume of the ink droplet 5 is calculated by measuring the cross-sectional area or the height of the ink droplet 5 by using the measuring device 800 attached to the inkjet head 700, rather than the measuring device 620 formed on the measurement conveying device 600.

Alternative exemplary embodiments include configurations wherein, the volume of the ink droplet 5 may be obtained by dripping the ink droplet 5 on the substrate 110, separating the substrate 110 from the inkjet printing system, hardening the ink droplet 5 at a piece of external equipment (not shown), and measuring the cross-section area and the height of the ink droplet 5. In such an alternative exemplary embodiment, a device for measuring the ink droplet 5 may not be included in the inkjet printing system.

As described, an amount of ink discharged from the inkjet head 700 may be controlled based on the measured volume or weight of the ink droplet 5 dripped on the substrate 110.

An exemplary embodiment of a display device manufactured using the exemplary embodiment of an inkjet printing system according to the present invention may be an LCD or an organic light emitting device ("OLED").

Referring to FIG. 9 and FIG. 10, and FIG. 1 to FIG. 8, an LCD manufactured using an exemplary embodiment of an inkjet printing system in which a discharge amount of ink is controlled, and an exemplary embodiment of a manufacturing method thereof will be described in detail.

Figure 9:
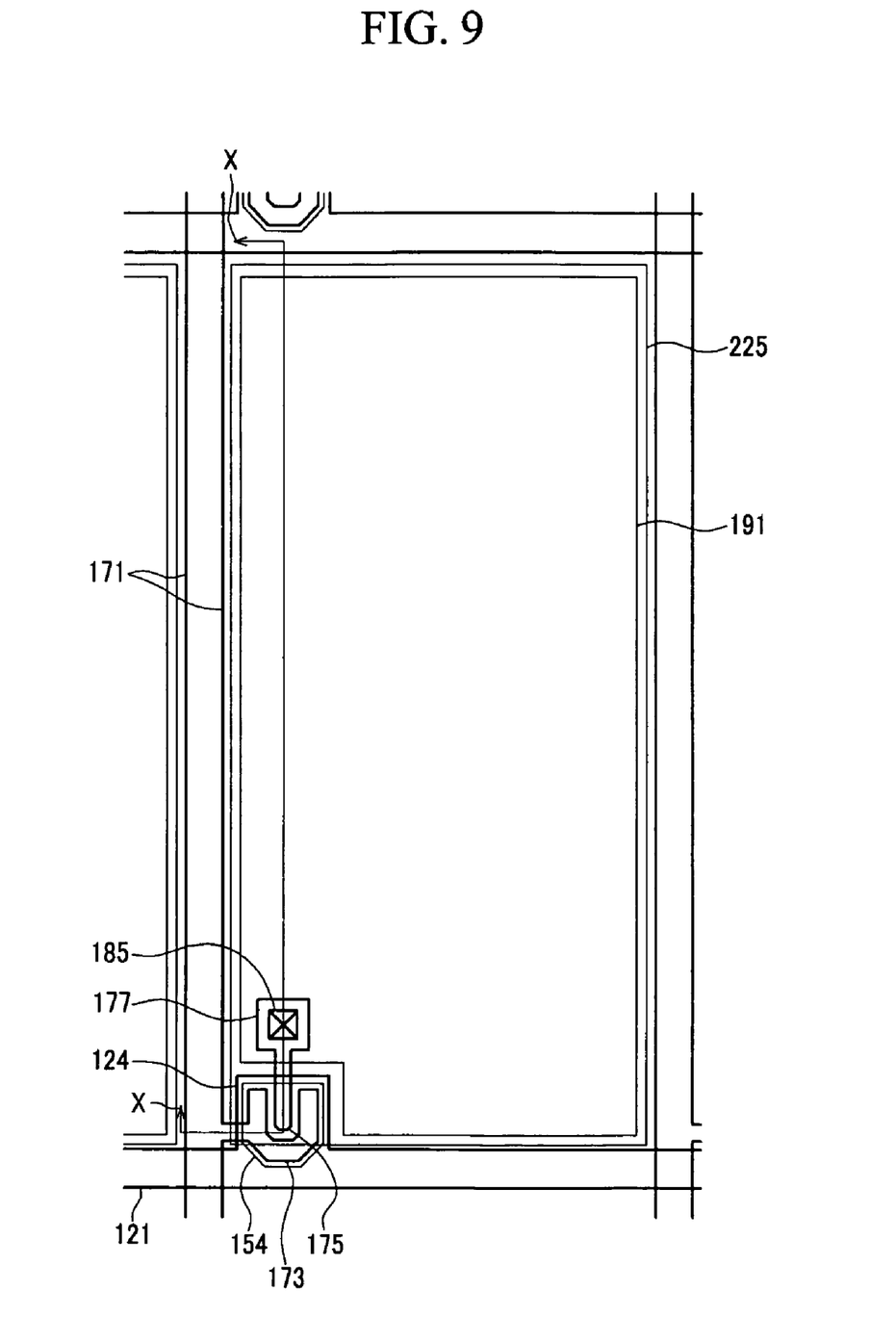
FIG. 9 is a top plan layout view of a liquid crystal display ("LCD") manufactured using an exemplary embodiment of an inkjet printing system according to the present invention.
Figure 10:
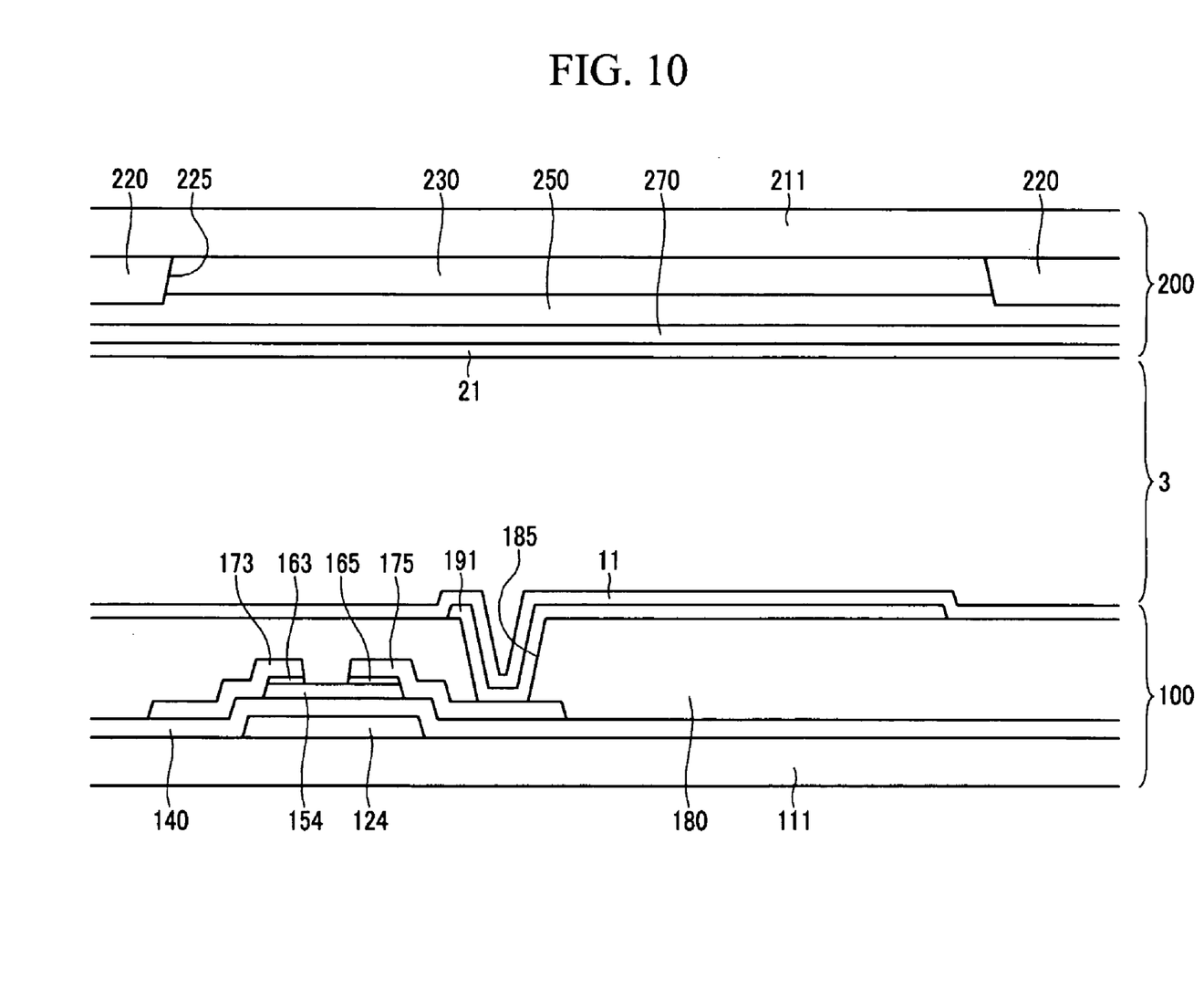
FIG. 10 is a cross-sectional view of the exemplary embodiment of an LCD of FIG. 9 taken along line X-X.

FIG. 9 is a top plan layout view of an exemplary embodiment of an LCD manufactured using an exemplary embodiment of an inkjet printing system according to the present invention, and FIG. 10 is a cross-sectional view of the exemplary embodiment of an LCD of FIG. 9 taken along line X-X.

As shown in FIG. 9 and FIG. 10, the exemplary embodiment of an LCD according to the present invention includes a thin film transistor ("TFT") array panel 100, a color filter array panel 200, and a liquid crystal layer 3. The TFT array panel 100 and the color filter array panel 200 face each other, and the liquid crystal layer 3 is interposed therebetween.

First, the TFT array panel 100 will be described.

A plurality of gate conductors including a plurality of gate lines 121 are formed on an insulation substrate 111, exemplary embodiments of which may be made of transparent glass, plastic or other similar materials.

The gate lines 121 transmit gate signals and extend in a substantially transverse direction, and include a plurality of gate electrodes 124 protruding upward therefrom.

In one exemplary embodiment, the gate conductors 121 may be made of an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, or chromium (Cr), tantalum (Ta), titanium (Ti), etc. However, exemplary embodiments include configurations wherein the gate conductor 121 may be made of various other metals or conductors.

On the gate conductor 121, a gate insulating layer 140, exemplary embodiments of which may be made of silicon nitride ("SiNx") or silicon oxide ("SiOx"), is formed.

On the gate insulating layer 140, a plurality of semiconductor islands 154, exemplary embodiments of which may be made of hydrogenated amorphous silicon (abbreviated as a-Si) or polysilicon, are formed. Each semiconductor 154 is placed on the gate electrode 124.

A pair of ohmic contacts 163 and 165 are formed on each of the semiconductor islands 154. Exemplary embodiments of the ohmic contacts 163 and 165 may be made of n+ hydrogenated amorphous silicon where n-type impurities such as phosphorus are doped at a high concentration, or of silicide.

Data conductors including data lines 171 and drain electrodes 175 are formed on the ohmic contacts 163 and 165 and the gate insulating layer 140.

The data lines 171 transmit data signals and extend in the substantially longitudinal direction such that they are disposed substantially perpendicular to the gate lines 121. Each data line 171 includes a plurality of source electrodes 173 extending to the gate electrode 124.

The drain electrodes 175 are separated from the data lines 171, and face the source electrodes 173 with respect to the gate electrode 124. In the present exemplary embodiment, each drain electrode 175 includes a one-sided wide end portion 177 and one opposite-side bar-shaped end portion. Alternative exemplary embodiments include configurations wherein the drain electrodes 175 have other shapes as would be apparent to one of ordinary skill in the art.

Exemplary embodiments include configurations wherein the data conductors 171 and 175 may be made of a refractory metal, exemplary embodiments of which may include molybdenum, chromium, tantalum, and titanium, and other materials with similar characteristics or alloys thereof, and may have a multi-layered structure including a refractory metal layer (not shown) and a low resistance conductive layer (not shown). However, the data conductors 171 and 175 may be made of various metal or conductors as would be apparent to one of ordinary skill in the art.

A single gate electrode 124, a single source electrode 173, and a single drain electrode 175 together with the semiconductor islands 154 form a single TFT, and a channel of the TFT is formed in a semiconductor island 154 interposed between the source electrode 173 and the drain electrode 175.

The ohmic contacts 163 and 165 are disposed between the underlying semiconductor islands 154 and the overlying data lines 171 and drain electrodes 175 so as to lower the contact resistance therebetween.

A passivation layer 180 is formed on the data lines 171, the drain electrodes 175, and exposed portions of the semiconductor islands 154. In one exemplary embodiment, the passivation layer 180 may be made of an inorganic insulator or an organic insulator, and may have a flat surface.

A plurality of contact holes 185 that expose the drain electrodes 175 are formed in the passivation layer 180.

A plurality of pixel electrodes 191, exemplary embodiments of which may be made of a transparent conductive material such as ITO or IZO, or a reflective metal such as aluminum, silver, chromium, or alloys thereof may be formed on the passivation layer 180.

The pixel electrodes 191 are physically and electrically connected to the drain electrodes 175 through the contact holes 185, and receive a data voltage from the drain electrodes 175.

A color filter array panel 200 will now be described.

A light blocking member 220 is formed on an insulation substrate 211, exemplary embodiments of which may be made of transparent glass or plastic. The light blocking member 220 is also referred to as a black matrix, and prevents light leakage.

A plurality of color filters 230 are formed in the substrate 211 and an opening 225 of the light blocking member 220. The color filters 230 mostly exist within a region surrounded by the light blocking member 230, and may longitudinally extend along the pixel electrodes 191. Each color filter 230 may display one of a plurality of primary colors, such as three primary colors of red, green, and blue.

An overcoat 250 is formed on the color filters 230 and the light blocking members 220. In one exemplary embodiment, the overcoat 250 may be made of an (organic) insulator, and prevents the color filter 230 from being exposed and provides a flat surface. Alternative exemplary embodiments include configurations wherein the overcoat 250 may be omitted.

A common electrode 270 is formed on the overcoat 250. The common electrode 270 may be made of a transparent conductor, exemplary embodiments of which include ITO or IZO or other materials having similar characteristics.

Alignment layers 11 and 21 that determine alignment of liquid crystal molecules (not shown) of the liquid crystal layer 3 are coated on inner surfaces of the display panels 100 and 200. The alignment layers 11 and 21 may be horizontal or vertical alignment layers.

The alignment layers 11 and 21 may be formed using the previously described exemplary embodiment of an inkjet printing system.

As previously described, an alignment liquid such as polyimide is dripped onto the substrate 110 through the nozzles (not shown) of the inkjet head 700, and measurement is performed by using the measuring devices 620 and 800 so as to control a discharge amount to be uniform. Here, the substrate 110 may be the insulation substrate 111 on which gate conductors 121, a gate insulating layer 140, semiconductors 154, ohmic contacts 163 and 165, data conductors 171 and 175, a passivation layer 180, and pixel electrodes 191 are formed, or the insulation substrate 211 on which light blocking members 220, color filters 230, an overcoat 250, and a common electrode 270 are formed. The nearly completed TFT panel 100 or the nearly completed common electrode panel 200 is mounted on the stage 500, and then the inkjet head 700 is moved and drips the alignment liquid so as to form the alignment layer 11 or 21.

Particularly, when the process restarts after interruption as the inkjet head 700 is replaced or another device is changed, alignment layers having a uniform thickness may be formed by measuring and controlling the discharge amount from the inkjet head 700 and forming the alignment layer.

Other thin films besides the alignment layers 11 and 21, such as gate conductors 121, data conductors 171 and 175, or color filters 230 other than the alignment layers 11 and 21 may be formed using the exemplary embodiment of an inkjet printing system according to the present invention.

An exemplary embodiment of an organic light emitting device manufactured using an exemplary embodiment of an inkjet printing system according to the present invention will now be described.

Figure 11:
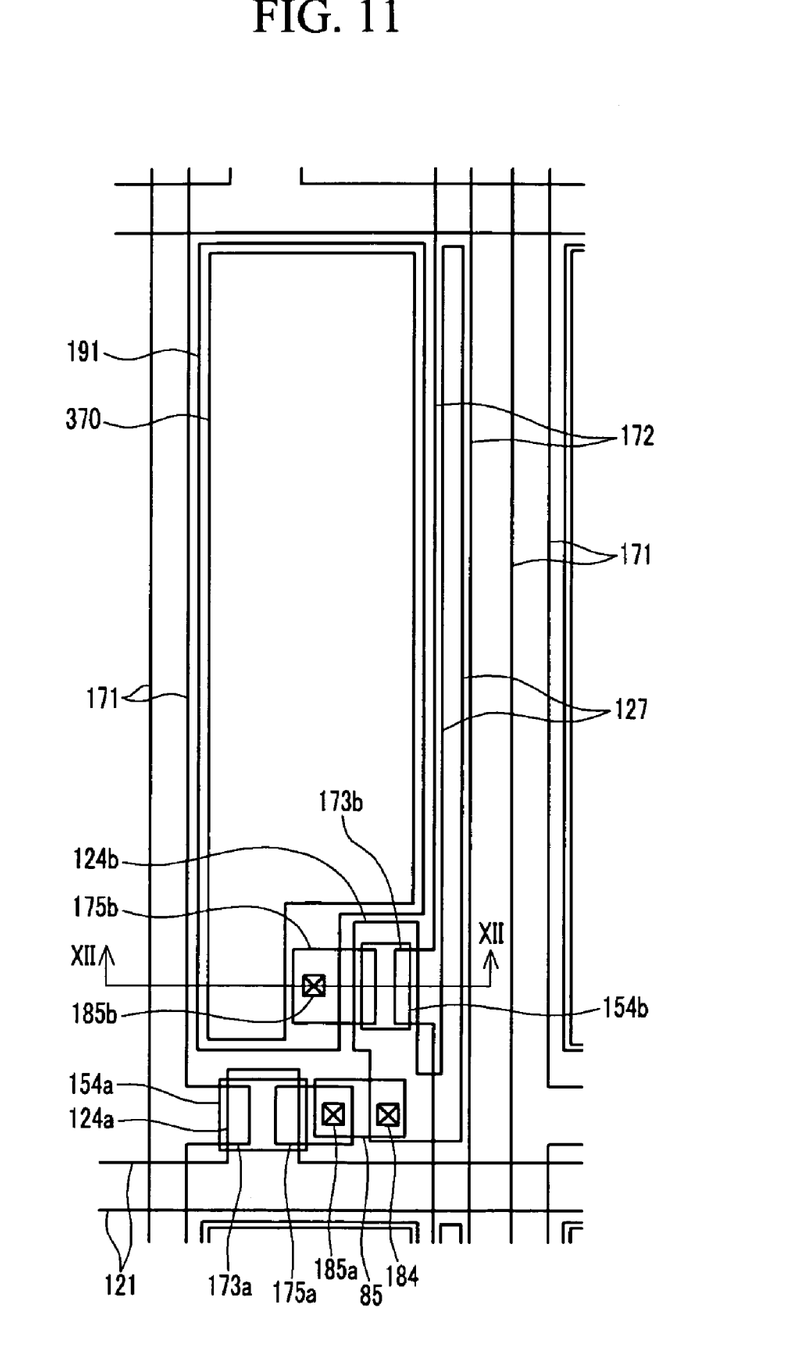
FIG. 11 is a top plan layout view of an organic light emitting device ("OLED") manufactured using an exemplary embodiment of an inkjet printing system according to the present invention.
Figure 12:
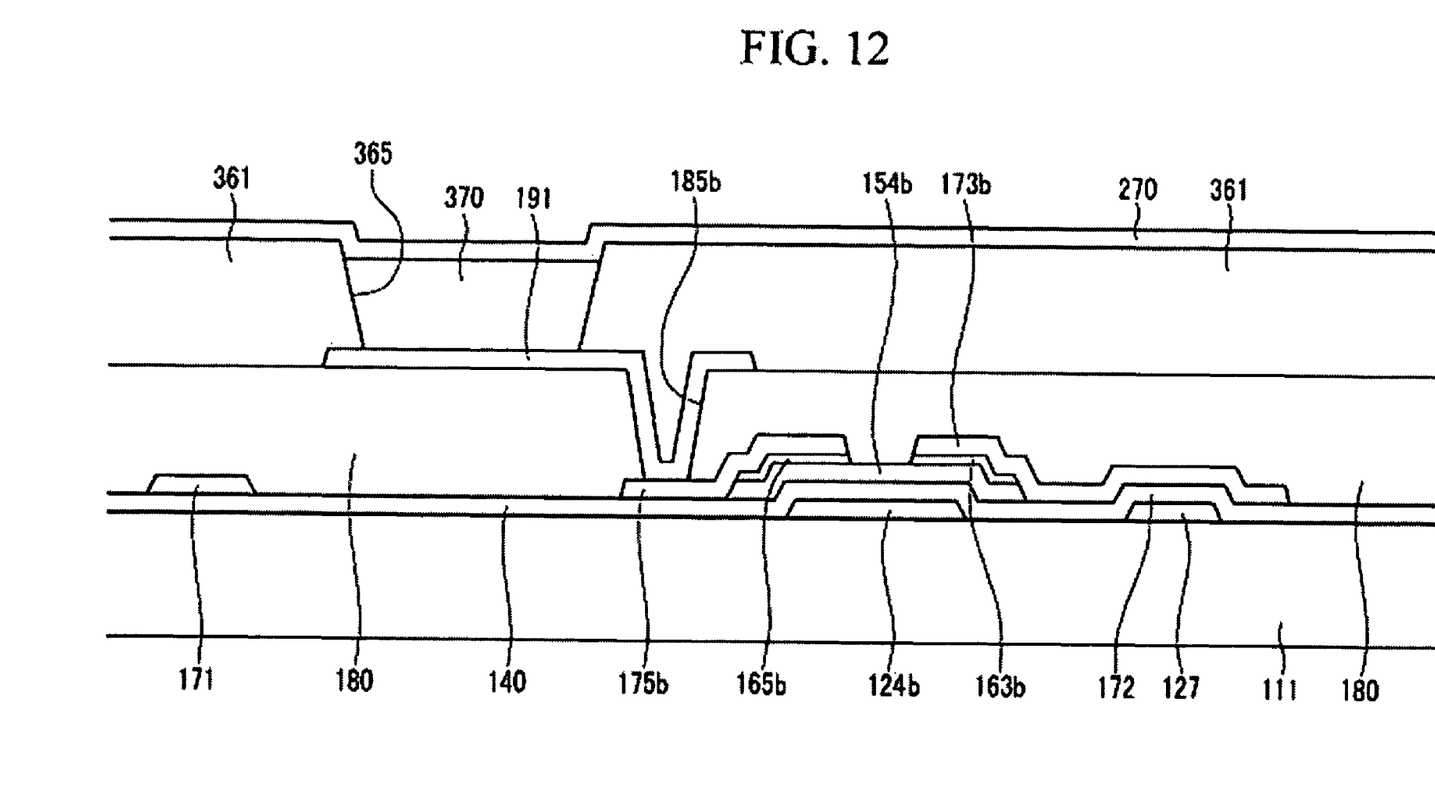
FIG. 12 is a cross-sectional view of the exemplary embodiment of an OLED of FIG. 11 taken along line XII-XII.

FIG. 11 is a top play layout view of an exemplary embodiment of an organic light emitting device manufactured using an exemplary embodiment of an inkjet printing system according to the present invention, and FIG. 12 is a cross-sectional view of the organic light emitting device of FIG. 11 taken along line XII-XII.

A plurality of gate lines 121 including first control electrodes 124a and a plurality of gate conductors including a plurality of second control electrodes 124b are formed on an insulation substrate 110.

Each second control electrode 124b extends from a storage electrode 127. In the present exemplary embodiment, the storage electrode 27 extends in a direction substantially perpendicular to the gate lines 121 away from the second control electrode 124b, then extends substantially parallel to the gate lines 121, and then again extends in a direction substantially perpendicular to the gate lines 121.

A gate insulating layer 140 is formed on the gate conductors, and a plurality of first and second semiconductor islands 154a and 154b are formed on the gate insulating layer 140. The first and second semiconductor islands 154a and 154b are respectively located on the first and second control electrodes 124a and 124b.

A plurality of pairs of first ohmic contacts (not shown) and a plurality of pairs of second ohmic contacts 163b and 165b are respectively formed on the first and second semiconductors 154a and 154b. The first ohmic contacts (not shown) are disposed on the first semiconductor 154a in pairs, and the second ohmic contacts 163b and 165b are disposed on the second semiconductor 154b in pairs.

A plurality of data conductors including a plurality of data lines, a plurality of driving voltage lines 172, and a plurality of first and second output electrodes 175a and 175b are formed on the ohmic contacts 163b and 165b and the gate insulating layer 140.

The driving voltage lines 172 transmit a driving voltage, and extend in the vertical direction such that they are disposed substantially perpendicular to the gate lines 121. Each of the driving voltage lines 172 includes a plurality of second input electrodes 173b extending to the second control electrodes 124b. The driving voltage lines 172 and the storage electrodes 127 are overlapped with each other, and in exemplary embodiments may be connected to each other.

The first and second output electrodes 175a and 175b are separated from each other, and are separated from the data lines 171 and the driving voltage lines 172. The first input electrode 173a and the first output electrode 175a face each other with respect to the first control electrode 124a, and the second input electrode 173b and the second output electrode 175b face each other with respect to the second control electrode 124b.

A passivation layer 180 is formed on the data conductors 171, 172, 175a, and 175b and an exposed portion of the semiconductors 154a and 154b.

A plurality of contact holes 185a and 185b that expose the first and second output electrodes 175a and 175b are formed in the passivation layer 180, and a plurality of contact holes 184 that expose the second input electrode 124b are formed on the passivation layer 180 and the gate insulating layer 140.

A plurality of pixel electrodes 191 and a plurality of connecting members 85 are formed on the passivation layer 180. The pixel electrodes 191 and connecting members 85 may be made of a transparent conductive material, exemplary embodiments of which include ITO or IZO, or a reflective metal, exemplary embodiments of which include aluminum, silver, or alloys thereof.

The pixel electrode 191 is physically and electrically connected to the second output electrode 175b through the contact hole 185b, and the connecting member 85 is connected to the second control electrode 124b and the first output electrode 175a through the contact holes 184 and 185a.

Partitions 361 are formed on the passivation layer 180. The partition 361 defines an opening 365 by surrounding edges of the pixel electrode 191 like a bank, and exemplary embodiments thereof may be made of an organic insulator or an inorganic insulator.

An organic light emitting member 370 is provided in the opening 365 on the pixel electrode 191, defined by the partition 361. In one exemplary embodiment, the organic light emitting member 370 may be made of an organic material that emits any one of three primary colors of red, green, and blue or a non-primary color such as white. The organic light emitting device displays a desired image by spatially combining primary colors of the organic light emitting members 370.

A common electrode 270 is formed on the organic light emitting member 370 and the common electrode 270. The common electrode 270 receives a common voltage, and may be made of a reflective metal, exemplary embodiments of which include calcium Ca, barium (Ba), magnesium (Mg), aluminum, and silver, or a transparent conductive material, exemplary embodiments of which include ITO or IZO.

In such an organic light emitting device, the first control electrode 124a connected to the gate line 121, the first input electrode 173 connected to the data line 171, and the first output electrode 175a, together with the first semiconductor 154a form a switching thin film transistor TFT. In addition, the second control electrode 124b connected to the first output electrode 175a, the second input electrode 173b connected to the driving voltage line 172, and the second output electrode 175b connected to the pixel electrode 191, together with the second semiconductor 154b form a driving TFT. The pixel electrode 191, the organic light emitting member 370, and the common electrode 270 form an organic light emitting diode, and the pixel electrode 191 serves as an anode and the common electrode 270 serves as a cathode, or, alternatively, the pixel electrode 191 serves as a cathode and the common electrode 270 serves as an anode of the organic light emitting diode.

Although the present exemplary embodiment is related to an OLED having semiconductor islands 154a and 154b made of amorphous silicon, in alternative exemplary embodiments it may be related to an organic light emitting device having semiconductor islands made of polysilicon.

In the present exemplary embodiment, layers including signal lines such as the gate conductors 121 and 124b and the data conductors 171, 172, 175a, and 175b and the organic light emitting members 370 may be formed using an exemplary embodiment of an inkjet printing system according to the present invention as described previously. As previously described, the thicknesses of layers may be uniformly formed by first measuring a discharge amount from the inkjet head 700 before performing an inkjet printing process for forming layers.

Features of the exemplary embodiment of an LCD shown in FIG. 9 and FIG. 10 also may be applied to the present exemplary embodiment.

As described, according to an exemplary embodiment of the present invention, an amount of discharged ink in an inkjet printing system for manufacturing a display device may be precisely measured.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An inkjet printing system comprising:
a stage configured for mounting a substrate thereon;
an inkjet head which drips an ink droplet on the substrate;
a conveying device which moves the inkjet head; and
a measuring device which measures a height of the ink droplet on the substrate, wherein the measuring device comprises:
a light source;
a mid-mirror which transmits light from the light source through a first side thereof and reflects incident light from a second side substantially opposite the first side;
a photo-detector which detects an amount of light;
a pinhole plate disposed between the mid-mirror and the photo-detector and including a pinhole; and
a horizontal scanning unit configured to move in a horizontal direction.

2. The inkjet printing system of claim 1, wherein the measuring device further comprises a vertical scanning unit configured to move in a vertical direction.

3. An inkjet printing system comprising:
a stage configured for mounting a substrate thereon;
an inkjet head which drips an ink droplet on the substrate;
a conveying device which moves the inkjet head; and
a measuring device which obtains a volume of the ink droplet on the substrate, wherein the measuring device comprises:
a light source;
a mid-mirror which transmits light from the light source through a first side thereof and reflects incident light from a second side substantially opposite the first side;
a photo-detector which detects an amount of light;
a pinhole plate disposed between the mid-mirror and the photo-detector and including a pinhole; and
a horizontal scanning unit configured to move in a horizontal direction.

4. The inkjet printing system of claim 3, wherein the measuring device further comprises a vertical scanning unit configured to move in a vertical direction.

5. The inkjet printing system of claim 3, wherein the light source comprises a semiconductor laser.

6. The inkjet printing system of claim 3, wherein the measuring device further comprises an object lens which gathers light that has passed through the mid-mirror at a focus.

7. The inkjet printing system of claim 3, wherein the measuring device obtains the volume of the ink droplet by measuring a height of the ink droplet.

8. The inkjet printing system of claim 7, wherein the measuring device obtains the volume of the ink droplet by further measuring a surface area of a contact region between the ink droplet and the substrate.

9. The inkjet printing system of claim 3, wherein the measuring device obtains the volume of the ink droplet by measuring an area of a cross-section of the ink droplet which is substantially perpendicular to a plane of the substrate.

10. A method of manufacturing a display device using an inkjet printing system comprising a stage, an inkjet head, a conveying device, and a measuring device, the manufacturing method comprising:
mounting a substrate on the stage of the inkjet printing system;
placing the inkjet head of the inkjet printing system over the substrate;
dripping an ink droplet on the substrate;
obtaining a volume of the ink droplet using the measuring device;
controlling dripping of subsequent ink droplets based on the obtained volume, wherein the measuring device comprises:
a light source;
a mid-mirror which transmits light from the light source through a first side thereof and reflects incident light from a second side substantially opposite the first side;
a photo-detector which detects an amount of light;
a pinhole plate disposed between the mid-mirror and the photo-detector and including a pinhole; and
a horizontal scanning unit configured to move in a horizontal direction.

11. The manufacturing method of claim 10, wherein the measuring device further comprises a vertical scanning unit configured to move in a vertical direction.

12. The manufacturing method of claim 10, wherein the obtaining of the volume of the ink droplet comprises measuring a height of the ink droplet and a surface area of a contact region between the ink droplet and the substrate using the measuring device.

13. The manufacturing method of claim 10, wherein the obtaining of the volume of the ink droplet comprises measuring an area of a cross-section of the ink droplet which is substantially perpendicular to a plane of the substrate using the measuring device.

14. The manufacturing method of claim 13, wherein the measuring of the area of the cross-section of the ink droplet which is substantially perpendicular to the plane of the substrate comprises moving the horizontal scanning unit and the vertical scanning unit.

15. The manufacturing method of claim 14, wherein the area of the cross-section of the ink droplet which is substantially perpendicular to the plane of the substrate is measured while the measuring device scans the ink droplet along the plane of the substrate.

16. The manufacturing method of claim 10, further comprising hardening the ink droplet by applying heat.

17. The manufacturing method of claim 10, wherein the obtaining of the volume of the ink droplet is performed at at least one location inside or outside the inkjet printing system.

18. The manufacturing method of claim 10, further comprising, dismounting the substrate and mounting a substrate for a display device on the stage after the obtaining of the volume of the ink droplet.

19. The manufacturing method of claim 18, wherein the ink is one of ink for forming wiring components, ink for forming a color filter, ink for forming an organic light emitting member, and ink for forming an alignment liquid.

* * * * *